(12) United States Patent
Czubarow et al.

(10) Patent No.: US 8,865,996 B2
(45) Date of Patent: Oct. 21, 2014

(54) THERMOELECTRIC GENERATOR INCLUDING NANOFIBERS

(75) Inventors: Pawel Czubarow, Wellesley, MA (US); Philip Premysler, Washington, DC (US)

(73) Assignee: eM-TECH, Wellesley, MA (US)

( * ) Notice: Subject to any disclaimer, the term of this patent is extended or adjusted under 35 U.S.C. 154(b) by 745 days.

(21) Appl. No.: 12/678,396

(22) PCT Filed: Sep. 19, 2008

(86) PCT No.: PCT/US2008/010900
§ 371 (c)(1),
(2), (4) Date: Mar. 16, 2010

(87) PCT Pub. No.: WO2009/038767
PCT Pub. Date: Mar. 26, 2009

(65) Prior Publication Data
US 2010/0205920 A1    Aug. 19, 2010

Related U.S. Application Data

(60) Provisional application No. 60/994,326, filed on Sep. 19, 2007.

(51) Int. Cl.
| H01L 35/32 | (2006.01) |
| C04B 35/622 | (2006.01) |
| D01D 5/00 | (2006.01) |
| D01D 10/02 | (2006.01) |
| C01B 31/36 | (2006.01) |
| C04B 35/628 | (2006.01) |
| C22C 47/08 | (2006.01) |
| H01L 35/22 | (2006.01) |
| C22C 49/14 | (2006.01) |

(52) U.S. Cl.
CPC .......... *C04B 35/62281* (2013.01); *D01D 5/003* (2013.01); *C04B 2235/441* (2013.01); *D01D 10/02* (2013.01); *C04B 35/62259* (2013.01); *C01B 31/36* (2013.01); *C04B 35/62876* (2013.01); *C22C 47/08* (2013.01); *H01L 35/22* (2013.01); *C04B 2235/526* (2013.01); *C22C 49/14* (2013.01)
USPC ........................................ 136/212; 136/236.1

(58) Field of Classification Search
USPC ...................... 136/200, 201, 205, 236.1, 239; 423/324, 344, 345; 438/54, 55
See application file for complete search history.

(56) References Cited

U.S. PATENT DOCUMENTS 5,022,928 A * 6/1991 Buist ............................. 136/212
6,740,142 B2   5/2004 Buettner et al.
(Continued)

FOREIGN PATENT DOCUMENTS

DE     WO 2007/077065     *   7/2007

OTHER PUBLICATIONS

Li et al., Electrospinning of Polymeric and Ceramic Nanofibers as Uniaxially Aligned Arrays, Nano Letters, vol. 3, No. 8, pp. 1167-1171 (2003).*

*Primary Examiner* — Jayne Mershon

(57) ABSTRACT

Continuous ceramic (e.g., silicon carbide) nanofibers (502, 602, 604, 606, 608, 702, 704, 1102, 1104) which are optionally p or n type doped are manufactured by electrospinning a polymeric ceramic precursor to produce fine strands of polymeric ceramic precursor which are then pyrolyzed. The ceramic nanofibers may be used in a variety of applications not limited to reinforced composite materials (400), thermoelectric generators (600, 700) and high temperature particulate filters (1200).

9 Claims, 8 Drawing Sheets

(56) References Cited

U.S. PATENT DOCUMENTS

| | | |
|---|---|---|
| 7,151,129 B2 | 12/2006 | Ishikawa et al. |
| 2006/0065021 A1 | 3/2006 | Khatri et al. |
| 2006/0118158 A1* | 6/2006 | Zhang et al. .................. 136/205 |
| 2006/0204738 A1 | 9/2006 | Dubrow |
| 2006/0279905 A1 | 12/2006 | Chow et al. |
| 2007/0018361 A1 | 1/2007 | Xu |
| 2007/0170071 A1* | 7/2007 | Suh et al. ...................... 205/687 |
| 2008/0156364 A1* | 7/2008 | Feng et al. .................... 136/201 |
| 2008/0170982 A1* | 7/2008 | Zhang et al. ............... 423/447.3 |
| 2009/0004086 A1* | 1/2009 | Kuhling et al. ............... 423/276 |
| 2009/0044848 A1* | 2/2009 | Lashmore et al. ............ 136/201 |
| 2010/0139226 A1 | 6/2010 | Sigmund |

* cited by examiner

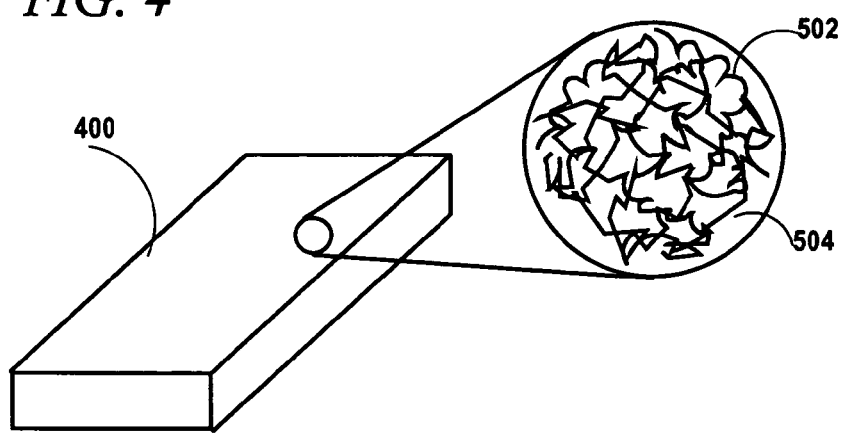
FIG. 4
FIG. 5
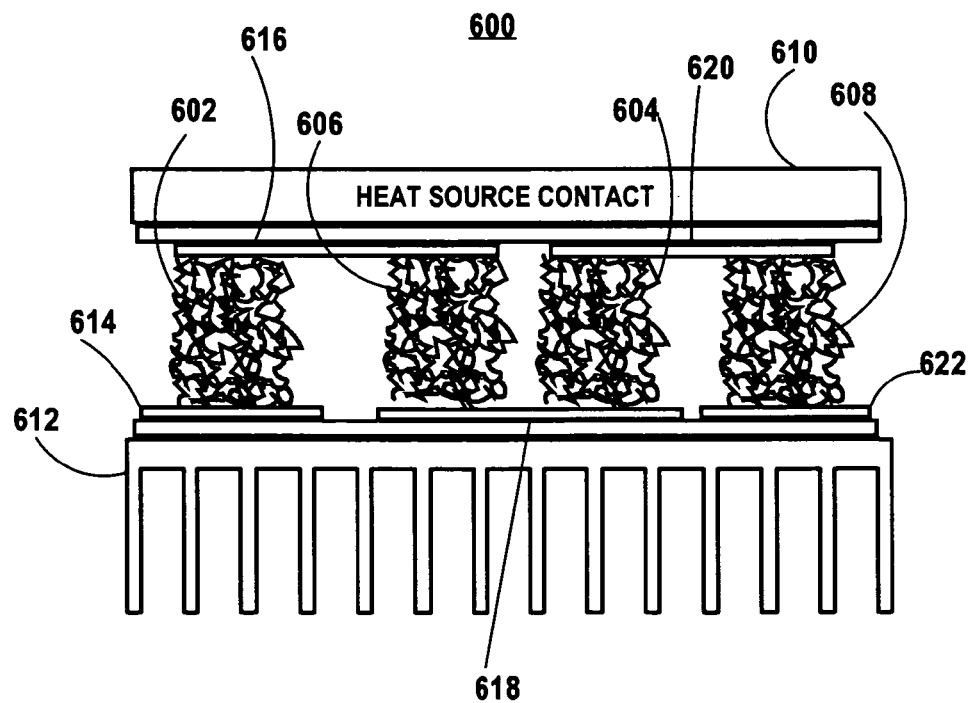
FIG. 6

THERMOELECTRIC GENERATOR INCLUDING NANOFIBERS

CROSS-REFERENCE TO RELATED APPLICATIONS

This application is a National Stage Application of PCT International Application No. PCT/US2008/010900 filed Sep. 19, 2008 which is based on U.S. Provisional Patent Application 60/994,326 filed Sep. 19, 2007.

FIELD OF THE INVENTION

The present invention relates in general to nanotechnology. More particularly, the present invention relates to continuous silicon carbide nanofibers.

BACKGROUND OF THE INVENTION

During the last 10 years there has been heightened interest in nanotechnology. Nanotechnology is concerned with properties of materials that arise only when at least one dimension of a material is reduced to a very minute scale. At such scales quantum mechanical effects arise leading to altered properties of the materials that is distinct from that of the bulk materials.

Ceramics are known to have many favorable characteristics for demanding engineering applications. It would be desirable to mass produce continuous ceramic nanofibers so that properties of ceramic materials including those that arise at nanoscales could be exploited.

Silicon carbide in particular is a material of extreme hardness (9 on Mohs' scale on which diamond is 10) and high modulus that is mainly used as an abrasive but has also been used as a semiconductor material in electronic devices. Although silicon carbide nanofibers have been produced by Chemical Vapor Deposition, the process is slow and costly and produces fibers of limited length. It would be desirable to be able to mass produce silicon carbide nanofibers.

BRIEF DESCRIPTION OF THE FIGURES

The present invention will be described by way of exemplary embodiments, but not limitations, illustrated in the accompanying drawings in which like references denote similar elements, and in which:

FIG. 4 shows a bar of composite material that has ceramic nanofibers embedded in a matrix of another material;

FIG. 5 is a magnified view of a portion of the bar shown in FIG. 3;

FIG. 6 is a schematic of a thermoelectric generator made with n and p type doped silicon carbide nanofibers;

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Figure 1:
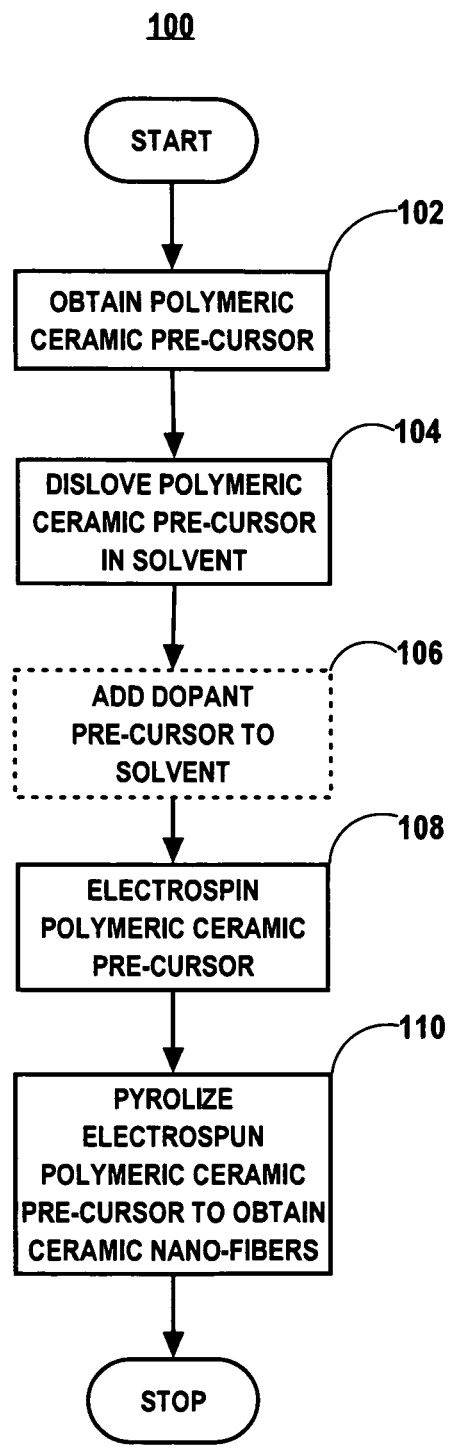
FIG. 1 is a flowchart of a method of producing ceramic nanofibers.

FIG. 1 is a flowchart of a method of producing continuous ceramic nanofibers 100, such as for example silicon carbide nanofibers. In block 102 a polymeric ceramic precursor is obtained. For example in order to produce silicon carbide one type of precursor that may be used is polycarbosilane made. Another type of silicon carbide precursor that may be used is polysilane. Both are available from by Starfire® Systems, Inc of Malta, N.Y. Polycarbosilanes are also available from Nippon Carbon, Co of Japan. Clariant's Kion Specialty Polymers of Charlotte, N.C. makes polysilazanes which are precursors to silicon nitride.

Another polymeric silicon carbide precursor that may be used can be synthesized by according to the teachings of U.S. Pat. No. 6,020,447. In brief '447 patent teaches a process that involves reductive coupling of chlorosilane to form polysilane in the presence of ultrasonification.

Polysilazanes precursors can be used to produce silicon nitride ($Si_3N4$) nanofibers. Polysilazanes are made by amonolysis of chlorosilanes. Polyborazine precursors can be used to produce boron nitride (BN) nanofibers. Polyborazine can be made by amonolysis of chloroboranes. Polyborane precursors can be used to produce boron carbide ($B_4C$). The foregoing can be pyrolized in argon or nitrogen.

Oxide ceramic nanofibers can also be made by the methods described herein. For example sol gels, or hydrolyzed alkoxides (e.g., titanium isopropoxide) can be pyrolized in air to obtain oxide type ceramic nano fibers. Some oxides can also be used to make thermoelectric devices.

In block 104 the polymeric ceramic precursor is dissolved in a solvent to produce a solution of polymeric ceramic precursor. A solvent such as toluene, tetrahydrofuran or mixtures thereof may be used.

For some applications such as the thermoelectric generators 500, 600, 700 shown in FIGS. 5, 6, 7 and described below it is desirable to obtain p and n type doped silicon carbide continuous nanofibers. In block 106 a dopant precursor is added to the solvent. A suitable p type dopant precursor is a phosphorous (III) organometallic compound e.g., _diphenylphosphino ethylene. A suitable polymeric precursor for making n type doped silicon carbide nanofibers can be made by dissolving SiC precursor in a suitable solvent in which is dissolved a small amount of dopant in a form of nitrogen containing species such as primary, secondary, or tertiary organic amines (e.g., melamine, ganidine), inorganic amines, organometallic silazanes.

Other dopants may also be made of boron, aluminum, and carbon containing organometallic compounds.

Figure 2:
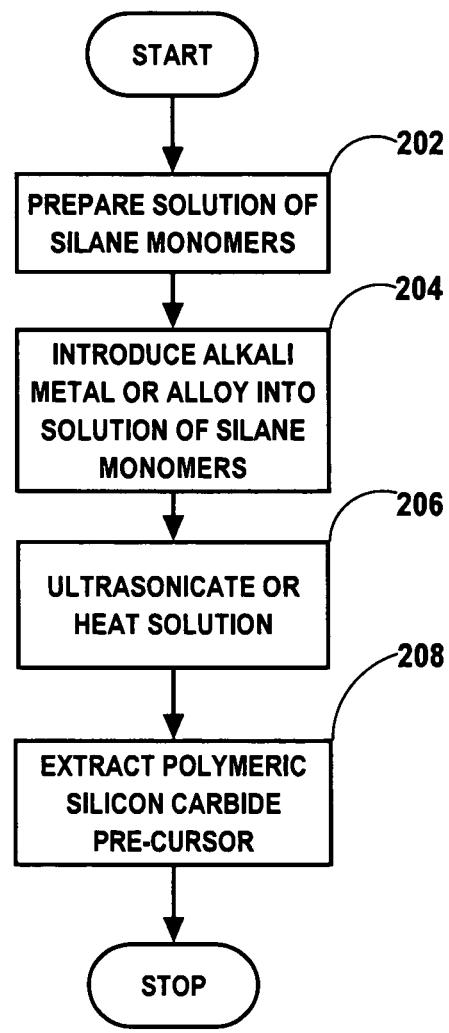
FIG. 2 is a flowchart of a method of preparing a silicon carbide precursor.

Referring again to FIG. 1 in block 108 the polymeric ceramic precursor is electrospun to produce fine continuous strands of polymeric ceramic precursor. An apparatus for electrospinning the polymeric ceramic precursor is shown in FIG. 2 and described below. In block 110 of the method 100 the fine continuous strands of polymeric ceramic precursor are pyrolized in order to convert the fine continuous strands of polymeric ceramic precursor into continuous ceramic nanofibers. The polymeric ceramic precursors can be pyrolized by heating to a temperature of 1000 C or more in an inert atmosphere of argon or nitrogen.

FIG. 2 is a flowchart of a method of preparing a silicon carbide precursor. In block 202 a solution of monomers (e.g., chlorosilane) in a solvent (e.g., toluene) is prepared. In block 204 an alkali metal (e.g., sodium) or an alloy including at least one alkali metal is introduced into the solution. In block 206 the solution is ultrasonicated or heated (e.g., to a temperature of ~80 C) to synthesize a polymeric precursor (e.g., polysilane) in the solution. In block 208 the polymeric precursor is extracted from the solution by centrifuging and subsequent washing.

Figure 3:
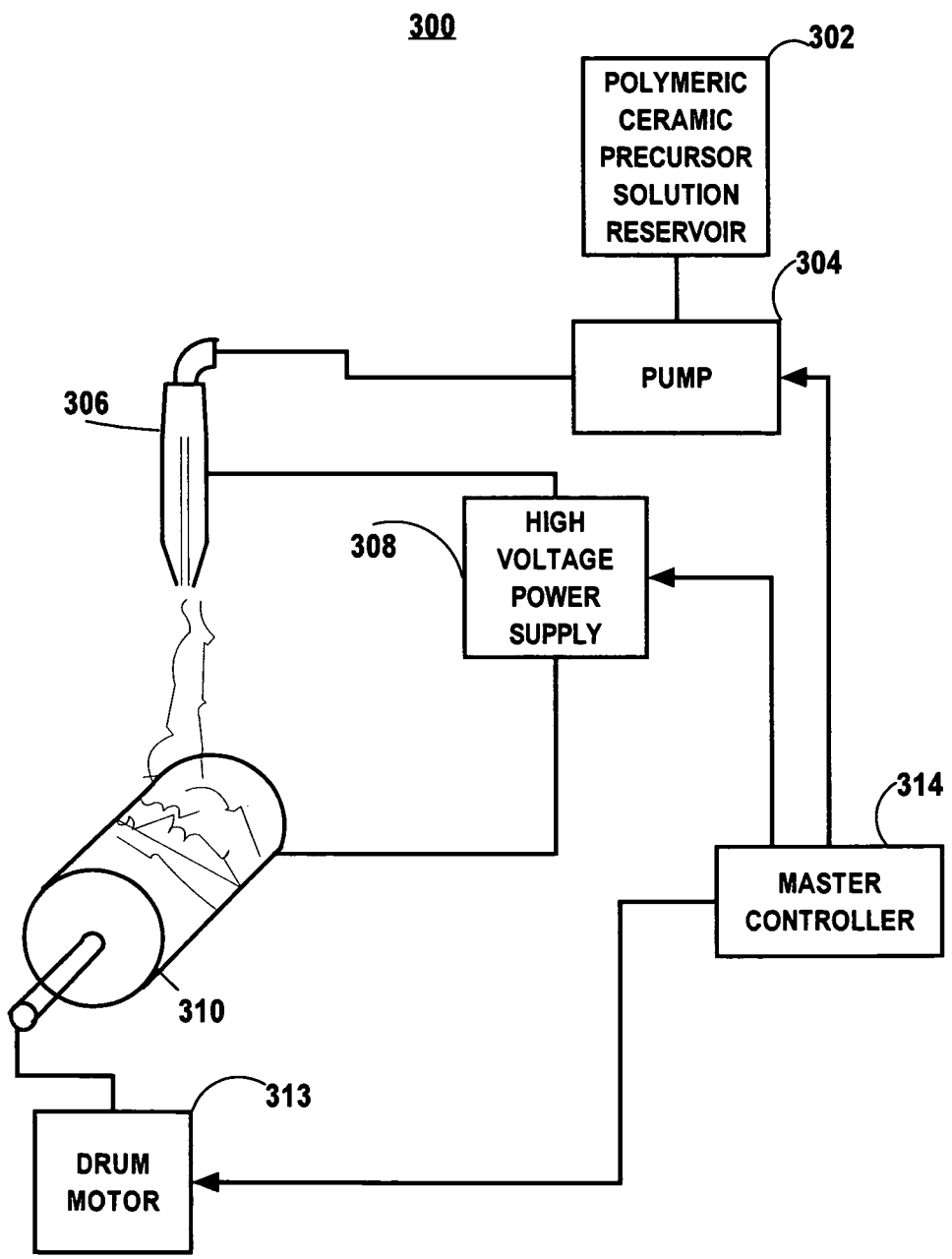
FIG. 3 is a schematic diagram of an apparatus for producing ceramic nanofibers.

FIG. 3 is a schematic diagram of an apparatus 300 for producing ceramic nanofibers, e.g., silicon carbide nanofibers. Referring to FIG. 3 it is seen that a reservoir of polymeric ceramic precursor solution 302 is connected to a pump 304. The pump 304 pumps the polymeric ceramic precursor solution to an electrospinning spinneret 306. A high voltage power supply 308 is connected to the spinneret 306 and to a drum 310. A high voltage potential is established between the spinneret 306 and the drum 310. The high voltage potential helps eject the polymeric ceramic precursor solution from the spinneret 306 and produce the fine stands of polymeric ceramic precursor. The fine continuous strands of polymeric ceramic precursor are collected on the drum 310. Periodically the drum can be stopped and the fine strands of polymeric ceramic precursor that have collected on the drum removed. A drum motor 312 turns the drum 310 as the apparatus 300 operates. A master controller 314, e.g., a desk top computer configured with instrument control software, is coupled to the drum motor 312, the high voltage power supply 308 and the pump 304 in order to control the operation of the apparatus 300. Continuous silicon carbide nanofibers that are produced by the apparatus shown in FIG. 3 and in accordance with the methods described with reference to FIG. 1 and FIG. 2 are distinguished by their length from silicon carbide nanofibers that are produced by CVD which are less than 1 millimeter in length.

Alternatively rather than using the drum 310 to collect the fine strands of polymeric ceramic precursor a flat plate, a conveyor belt or a continuous web of material may be used. According to another alternative, rather than using the drum 310, an object that has a shaped surface (formed by machining or another process) is used. The shaped surface acts as a template to determine the shape of a matt of fine continuous strands of polymeric ceramic nanofibers that is deposited thereon. For example for forming silicon carbide strips used in the thermoelectric generator described below and shown in FIGS. 7 and 8 a template that has a square wave surface profile may be used. In other cases templates may be used to form structural parts having a other shapes determined by the templates. The final shape of the nonwaven fiber strands can also be formed by embossing.

FIG. 4 shows a bar of composite material 400 that has ceramic nanofibers 502 embedded in a matrix of another material 504 and FIG. 5 is a magnified view of a portion of the bar 400 shown in FIG. 4. The other material that forms the matrix may for example be a polymeric material such as imidized polyamic acid (polyimide), polyester, or polyetheretherketone (PEEK), or a metal such as copper, tungsten, indium, gallium, or aluminum. In the case of the polymeric matrix the ceramic nanofibers may be added by infiltration of matrix in to the fibers in a molten state or in the case of polyimides, polyamic acid can be infiltrated and subsequently imidized to poyimide at >200 C. In the case of a metal matrix the ceramic nanofibers may be introduces by forcing them into the metal when the metal is in a molten state. The ceramic nanofibers enhance the mechanical properties, e.g., strength, modulus of the composite material. Optionally the ceramic nanofibers can be chopped before introducing them into the matrix material.

FIG. 6 is a schematic of a thermoelectric generator 600 made with strips of continuous n type doped silicon carbide nanofibers 602, 604 and strips of continuous p type doped silicon carbide nanofibers 606, 608. The strips are cut from mats of randomly aligned silicon carbide nanofibers. Silicon carbide nanofibers work well in the thermoelectric generator because their nanoscale causes phonons to scatter thereby enhancing their thermal resistance. As shown in FIG. 6 the n type doped silicon carbide nanofibers 602, 604 and the p type doped silicon carbide nanofiber 606, 608 are arranged in an alternating arrangement between a heat source contact 610 and a heat sink 612. The heat source contact can be put in contact with a source of waste heat such as the exhaust system of an internal combustion engine. A first terminal electrode 614 is positioned on the heat sink 612 in contact with a first strip 602 of n type doped silicon carbide nanofibers. A first coupling electrode 616 is positioned on the heat source contact 610 in contact with the first strip of n type doped silicon carbide nanofibers 602 and the first strip of p type doped silicon carbide nanofibers 606. A second coupling electrode 618 is positioned on the heat sink 612 in contact with the first strip of p type doped silicon carbide nanofibers 606 and the second strip of n type doped silicon carbide nanofibers 604. A third coupling electrode 620 is positioned on the heat source contact 610 in contact with the second strip of n type doped silicon carbide nanofibers 604 and the second strip of p type doped silicon carbide nanofibers 608. A second terminal electrode 622 is positioned on the heat sink 612 in contact with the second strip of p type doped silicon carbide nanofibers 608. The coupling electrodes 616, 618, 620 connect the silicon carbide nanofibers in a series circuit. The coupling electrodes 616, 618, 620 and the terminal electrodes 614, 622 also thermally couple the silicon carbide nanofibers 602, 604, 606, 608 to the heat source contact 610 and the heat sink 612. It is noted that the pattern of repeating n and p type doped silicon carbide nanofibers and coupling electrodes shown in FIG. 6 can be extended to provide higher voltage output. The strips of n and p type doped nanofibers extend perpendicularly into the plane of the drawing sheet, so that they have a relatively high area and so that the thermoelectric generator 600 generates a relatively high electrical current. At least portions of the silicon carbide nanofibers 602, 604, 606, 608 that are in contact with the coupling electrodes 616, 618, 620 can be metalized to enhance electrical coupling. Metallization may be accomplished by electroplating or electrolessly plating the silicon carbide nanofibers 602, 604, 606, 608 with a metal such as Cu, Ag, Ni. The plated portions can then be soldered or brazed to the coupling electrodes 602, 604, 606, 608. Alternatively, silver filled adhesives or glasses may be used in lieu of soldering or brazing in which case plating would also not be necessary.

Figure 7:
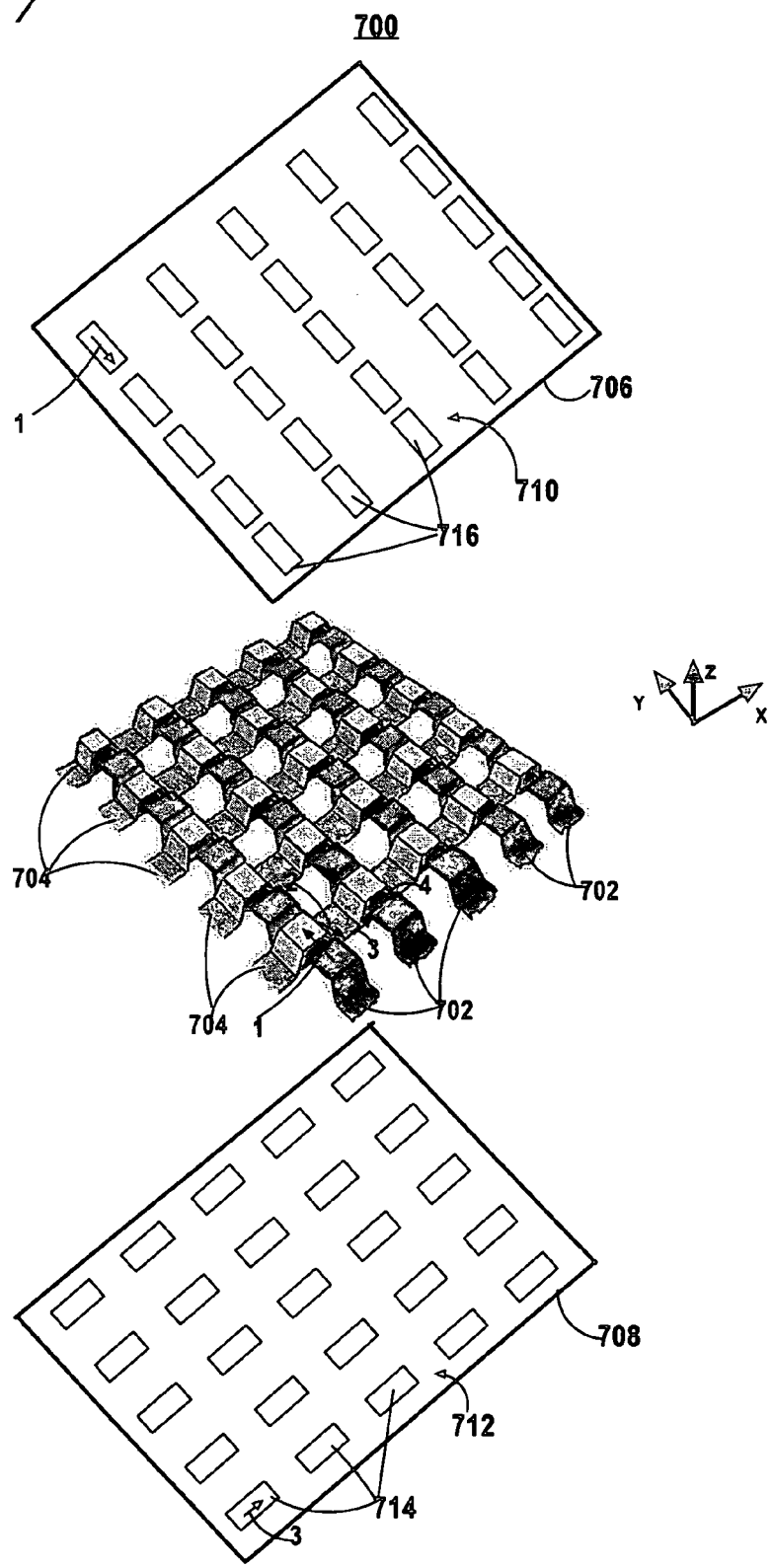
FIG. 7 is an explode view of a thermoelectric generator made with n and p type doped silicon carbide nanofibers according to another embodiment of the invention.

FIG. 7 is an exploded view of a thermoelectric generator 700 according to another embodiment of the invention. The thermoelectric generator 700 has a set of five rectilinear serpentine shaped strips of n type doped silicon carbide nanofibers 702 extending in a Y-axis direction (indicated in the figure). Arranged perpendicularly crossing the n type doped strips 702 are a set of five rectilinear serpentine shaped strips of p type doped silicon carbide nanofibers 704 extending in an X-axis direction (indicated in the figure). Although five strips of each type are shown in practice fewer or more of each type may be used. The strips also have the character of non-woven mats in that their thickness greatly exceeds the diameter of individual nanofibers and there is a relatively large volume of empty space separating the fibers. The strips 702, 704 are located between a heat source contact 706 and a heat sink contact 708. (Rather than using a heat sink contact a heat sink itself may be substituted.) A bottom surface 710 of the heat source contact 706 that faces the strips 702, 704 is visible in FIG. 7 along with a top surface 712 of the heat sink contact 708 that also faces the strips 702, 704. A plurality of cold-side coupling electrodes 714 (only a couple of which are numbered to avoid crowding the figure) are disposed on the top surface 712 of the heat sink contact 708, and a plurality of hot-side coupling electrodes 716 are disposed on the bottom surface 710 of the heat source contact 706. Applying, by analogy, the terms used to describe waves, it can be said that the strips 702, 704 have crests that are aligned, and make contact with, the hot side coupling electrodes 716 and troughs that are aligned, and make contact with, the cold side coupling electrodes 714. The hot-side coupling electrodes 716 extend in the Y-axis direction and couple pairs of crests of adjacent n type doped strips 702 and p type doped strips 704. The cold-side coupling electrodes 714 extend in X-axis direction and couple pairs of adjacent troughs of adjacent n type doped strips 702 and p type doped strips 704. The coupling electrodes 714, 716 and the strips 702, 704 together form a plurality of electrical circuit pathways through the thermoelectric generator 700. Arrows 1, 2, 3, 4 shown in FIG. 7 show a basic part of an electrical circuit pathway which repeats periodically in the X-direction forming a single electrical pathway through the thermoelectric generator 700. Arrow 1 goes through a hot-side coupling electrode 716 from an n type doped strip 702 to a p type doped strip 704. Arrow 2 goes down a sloped portion from a peak to a trough of the p type doped strip 704. Arrow 3 goes through a cold side coupling electrode 714 from the p type doped strip 704 to an n type doped strip 702 and arrow 4 goes up a sloped portion of the n type doped strip 702 from a trough to a peak. This pattern is repeated several times in traversing the generator 700 generally in the X-direction. Multiple such pathways through the generator can be connected either in series or in parallel depending on the impedance characteristic of the load that is to be powered by the thermoelectric generator. The rectilinear serpentine configuration provides for large contact areas, to increase the current generation capacity, while limiting parasitic thermal conductivity from the heat source contact 706 the heat sink contact 708.

By the term "rectilinear serpentine" used above to describe the strips it is meant that the contour is generally similar to a serpentine contour but is made up of linear segments as opposed to being continuously curved. Another way to describe the shape is "trapezoidal wave" shaped. Alternatively, in lieu of a trapezoidal wave shape the strips may be shaped as a saw tooth wave, triangular wave or square wave. More generally any periodic shape that successively makes contact with cold-side coupling electrodes 714.

In the case of the thermoelectric generator shown in FIG. 7, in order to make electrical contact with the coupling electrodes 714, 716, it will be sufficient to metallize electrolessly or by electroplating the crest and trough portions of strips and solder or braze these to the coupling electrodes 714, 716. Selected coupling electrodes may be used as terminal electrodes.

Figure 8:
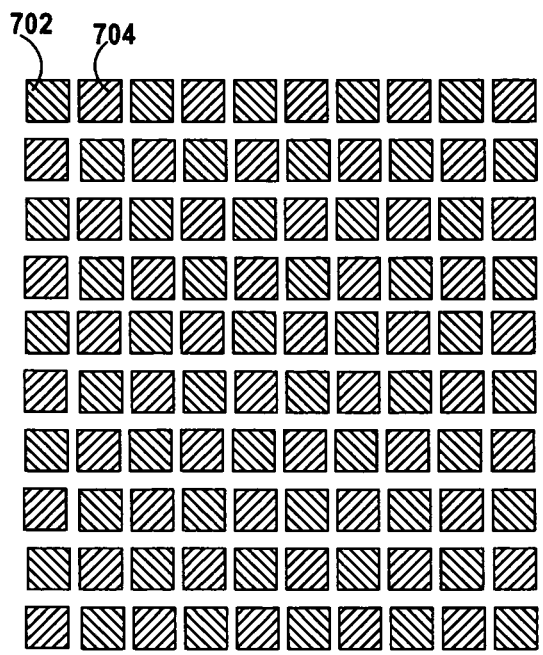
FIGS. 8 and 9 show top and bottom view of arrangement of trapezoidal wave shaped p and n type doped strips of silicon carbide nanofibers used to make a relatively high power density thermoelectric generator.
Figure 9:
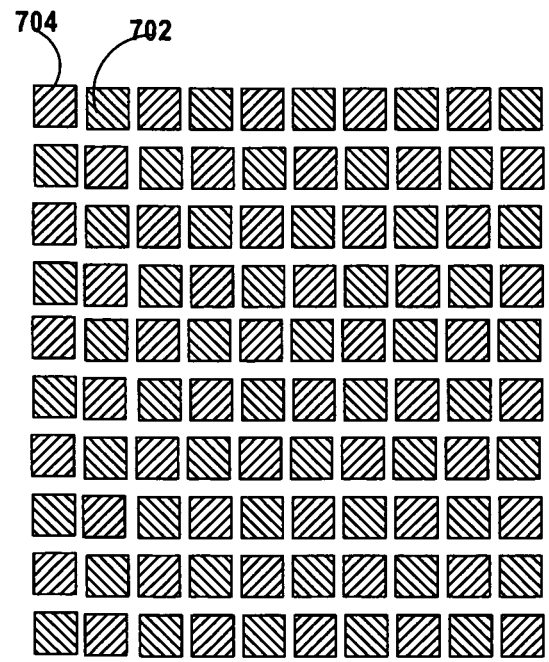
Figure 10:
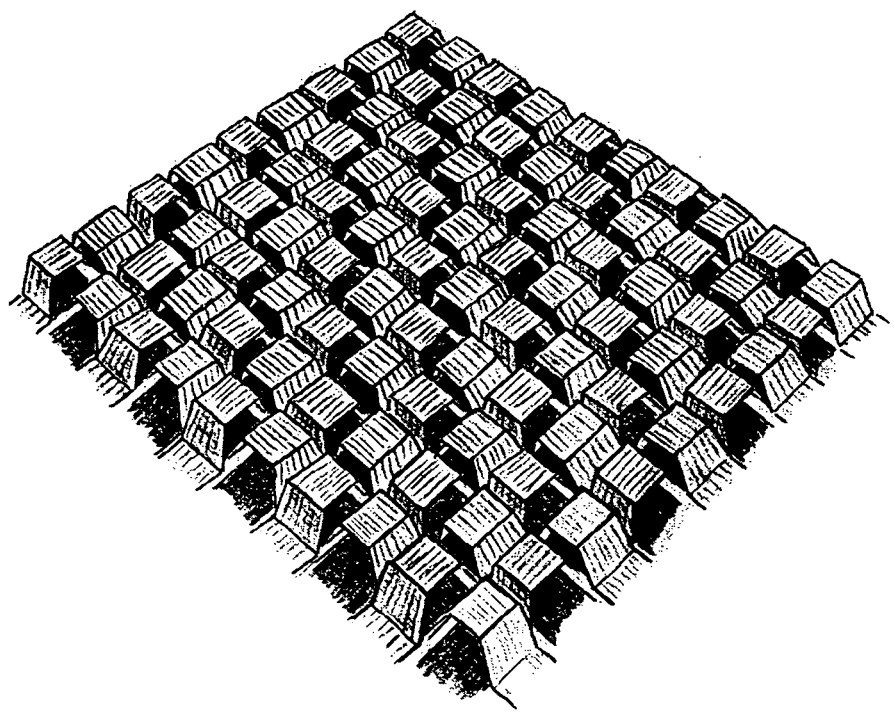
FIG. 10 shows a perspective view of the arrangement shown in FIGS. 8 and 9.

In order to increase the utilization of the areas of the heat source contact 706 and the heat sink contact 708, two arrangements of the strips 702 704 shown in FIG. 7 can be nested together. In particular between n type doped strips 702 shown in FIG. 7 there will be placed additional n type doped strips 702 that also extend in the Y-axis direction and additional p type doped strips 704 will be placed between those shown in FIG. 7 and arranged extending in the X-axis direction—as those shown in FIG. 7. Considering that the strips 702, 704 are periodic in shape, it can be said that the additional strips will be "phase shifted" by one-half the wavelength. In other words, a trough of each strip of each dopant type will be aligned with a crest of its neighbor of the same dopant type. The resulting nested structure will manifest a checker-board pattern of n type doped and p type doped areas when viewed from the top and bottom. Top and bottom views of the resulting structure are shown in FIGS. 8 and 9. In FIGS. 8 and 9 positive slope cross-hatched squares represents p type doped areas of the p type doped strips 704 and negative slope cross-hatched squares represent n type doped areas of the n type doped strips. FIG. 10 shows a perspective view of the arrangement shown in FIGS. 8 and 9. This design provides for increased electric power generation per unit volume of thermoelectric generator.

Figure 11:
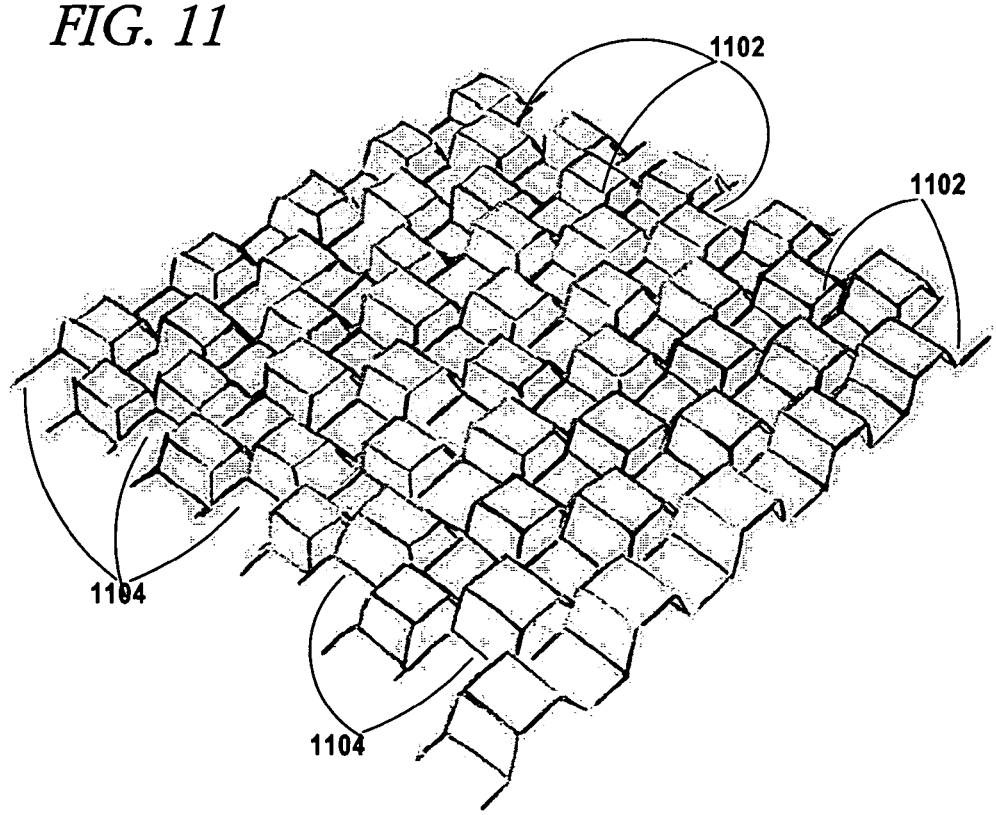
FIG. 11 shows an alternative arrangement of trapezoidal strips of n and p type doped silicon carbide nanofibers.

FIG. 11 shows an alternative arrangement of p type doped 1102 and n type doped 1104 trapezoidal wave shaped strips of silicon carbide nanofibers, that can be used in a thermoelectric generator such as shown in FIG. 6. In this case the strips 1102, 1104 extend in a common direction (e.g., into the plane of page, for FIG. 6.) This arrangement also offers the advantage of increased contact area (at the crests and troughs of the strips), for increased current generation while reducing cross section area of the material in gap of the thermoelectric generator so as to control parasitic thermal conduction between the hot side and the cold side of the thermoelectric generator.

Figure 12:
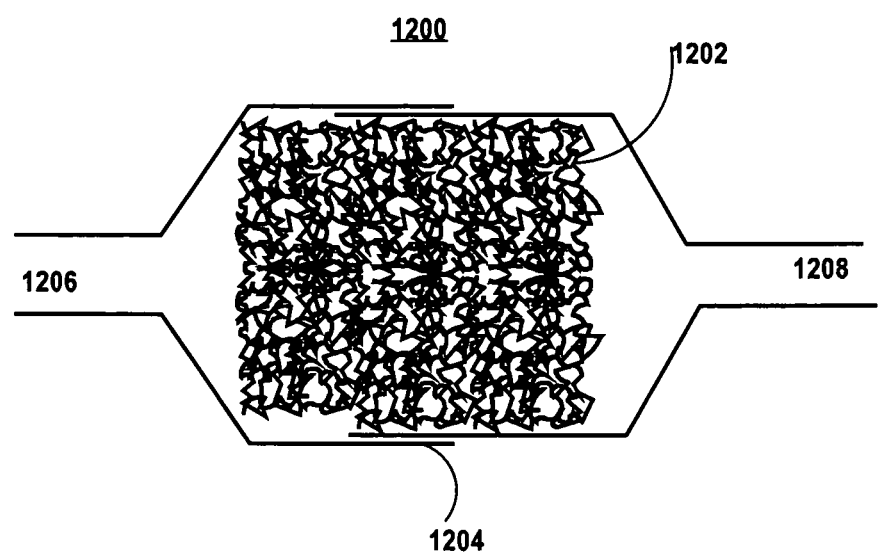
FIG. 12 is a particular filter that uses silicon carbide nanofiber filter media and is capable of operation at high temperature, e.g., for filtering diesel particulate motor exhaust.

FIG. 12 is a particular filter 1200 that uses ceramic, e.g., silicon carbide nanofiber filter media 1202 and is capable of operation at high temperature, e.g., for filtering diesel particulate motor exhaust. The ceramic nanofiber filter media 1202 is disposed in a housing 1204 that includes an inlet 1206 and an outlet 1208 to allow gas to flow through.

While the preferred and other embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

What is claimed is:

1. A thermoelectric generator comprising: a heat source contact; a heat sink; a mat of continuous, freestanding, pyrolized, electrospun p type doped nanofibers thermally coupled to said heat source contact and said heat sink; a mat of continuous, freestanding, pyrolized, electrospun n type doped nanofiber thermally coupled to said heat source contact and said heat sink; and a coupling electrode coupling said mat of continuous, freestanding, pyrolized, electrospun p type doped nanofibers and said mat of continuous, freestanding, pyrolized, electrospun n type doped nanofibers, wherein said p type doped nanofibers consist of thermoelectric ceramic material and said n type doped nanofibers consist of thermoelectric ceramic material.

2. The thermoelectric generator according to claim 1 wherein said mat of continuous, freestanding, pyrolized, electrospun p type doped nanofibers is formed as a first strip and said mat of continuous, freestanding, pyrolized, electrospun n type doped nanofiber is formed as a second strip.

3. The thermoelectric generator according to claim 2 wherein said first strip of continuous, freestanding, pyrolized, electrospun p type doped nanofibers has a periodic shape and is arranged extending in a first direction and said second strip of continuous, freestanding, pyrolized, electrospun n type doped nanofibers has said periodic shape and is arranged extending in a second direction different from said first direction and crossing said first strip of continuous, freestanding, pyrolized, electrospun p type doped nanofibers without touching.

4. The thermoelectric generator according to claim 3 further comprising a third strip of continuous, freestanding, pyrolized, electrospun p type doped nanofibers having said periodic shape and arranged extending in said first direction and phase shifted relative to said first strip by one-half a wavelength of said periodic shape.

5. The thermoelectric generator according to claim 4 further comprising a fourth strip of continuous, freestanding, pyrolized, electrospun n type doped nanofibers having said periodic shape and arranged extending in said second direction and phase shifted relative to said second strip by one half said wavelength of said periodic shape.

6. The thermoelectric generator according to claim 1 wherein said p type doped nanofibers and said n type doped nanofibers comprise silicon carbide.

7. The thermoelectric generator according to claim 1 wherein said mat of continuous, freestanding, pyrolized, electrospun p type doped nanofibers comprises randomly aligned nanofibers and said mat of continuous, freestanding, pyrolized, electrospun n type doped nanofibers comprises randomly aligned nanofibers.

8. A thermoelectric generator comprising: a heat source contact; a heat sink; a first strip of a P type doped material thermally coupled to said heat source contact and said heat sink; a first strip of a N type doped material thermally coupled to said heat source contact and said heat sink; a coupling electrode coupling said first strip of said P type doped material and said first strip of said N type doped material; and wherein said first strip of said P type doped material has a periodic shape and is arranged extending in a first direction and said strip of said N type doped material has said periodic shape and is arranged extending in a second direction different said first direction and crossing said first strip said first type of material without touching.

9. The thermoelectric generator according to claim 8 wherein said first strip has a trough and said second strip has a peak and said trough is aligned with said peak.

* * * * *